United States Patent [19]

Kato

[11] Patent Number: 5,054,991
[45] Date of Patent: Oct. 8, 1991

[54] WAFER POSITIONING APPARATUS

[75] Inventor: Katsuhiko Kato, Ichinomiya, Japan

[73] Assignee: MECS Corporation, Bisai, Japan

[21] Appl. No.: 483,850

[22] Filed: Feb. 23, 1990

[30] Foreign Application Priority Data

Oct. 24, 1989 [JP] Japan .................................. 1-276438

[51] Int. Cl.$^5$ .............................................. B25J 15/00
[52] U.S. Cl. ...................................... 414/783; 29/833;
108/20; 269/21; 269/71; 414/749; 414/754
[58] Field of Search ............... 414/752, 754, 757, 772,
414/776, 778, 779, 783; 901/47; 108/20, 140,
143; 29/832, 833; 269/71, 73, 903, 21

[56] References Cited

U.S. PATENT DOCUMENTS

| | | | |
|---|---|---|---|
| 3,881,605 | 5/1975 | Grossman | 414/754 X |
| 4,695,215 | 9/1987 | Jacoby et al. | 414/752 X |
| 4,729,536 | 3/1988 | Scala | 108/143 X |
| 4,770,600 | 9/1988 | Ishikawa | |

Primary Examiner—David A. Bucci
Assistant Examiner—Donald W. Underwood
Attorney, Agent, or Firm—Armstrong, Nikaido, Marmelstein, Kubovcik & Murray

[57] ABSTRACT

The wafer positioning apparatus has an X·Y axis drive mechanism for moving a mounting stock in the X-axis direction and the Y-axis direction in the X·Y coordinates on the horizontal plane; a wafer inserting section is fixed on the mounting stock and has a space for inserting a wafer horizontally; photosensors are installed at the wafer inserting section and arranged at regular intervals on positions corresponding to peripheral portions of the wafer so as to detect edge portions of the inserted wafer; and a rotary section is arranged at the center of the wafer inserting section to be attached to the center of the rear surface of the inserted wafer by suction. The wafer is held on a hand plate or the like of a separate carrier system and inserted horizontally into the center of the space within the wafer inserting section, and the photosensors act in this state and detect peripheral portions of the wafer, and at the same time the X·Y axis drive mechanism acts to move the mounting stock with the wafer inserting section in the X-axis direction and the Y-axis direction in response to detection by photocells so that the center position of the wafer inserting section and the center position of the wafer are registered. The wafer is then attached to the rotary section and rotated to proper angular position in response to detection of edge portions by the photosensors.

3 Claims, 3 Drawing Sheets

WAFER POSITIONING APPARATUS

BACKGROUND OF THE INVENTION

(1) Field of the Invention

The present invention relates to a wafer positioning apparatus which is used in a working process of semiconductor wafers for positioning a wafer with respect to a notched portion (orientation flat or notch) formed on a part of the wafer.

(2) Prior Art

When semiconductor wafers are worked or measured, the wafers are usually enclosed in a shelf-shaped cassette and then taken one after another out of the cassette by a carrier system and held on a stage of a processor. Since position of a notched portion of the wafer within the cassette is random and the positioning in the processor is performed with respect to the notched portion at the edge portion of the wafer, the wafer must be held on the stage so that the notched portion is at a definite position (for example, a definite position in front of the stage).

Therefore the wafer taken out of the cassette is once held on the positioning apparatus by the carrier system and transferred to the correct position with respect to the notched portion of the wafer and then held on the stage of the processor.

A wafer positioning apparatus used in such process in the prior art usually has structure that a wafer is rotatably supported and a rubber roller abuts on a peripheral portion of the wafer and is rotationally driven thereby the wafer is rotated, and when a notched portion of the wafer attains to a portion of the rubber roller or a portion of a photosensor or the like, the rotation of the wafer is stopped and the positioning is performed (for example, refer to Japanese patent application laid-open No. 16984/1979).

Consequently, when the wafer is positioned, the peripheral portion of the wafer is pushed and rotated by the rubber roller or is contacted with other member and is moved, thereby the peripheral portion of the weak wafer may be broken.

The present inventors have proposed a silicon wafer positioning apparatus in U.S. Pat. No. 4,770,600. Also in this apparatus, the positioning is performed in that both sides of a wafer are held and supported on a supporter and the end of the wafer is pushed by a movable weight and moved to the inside. Consequently, a wafer positioning apparatus to enable the positioning without touching the peripheral portion of the wafer has been desired.

SUMMARY OF THE INVENTION

A wafer positioning apparatus of the invention comprises X·Y axis drive mechanism for moving a mounting stock to the X-axis direction and the Y-axis direction in the X·Y coordinates on the horizontal plane; a wafer inserting section fixed on the mounting stock and having a space for inserting a wafer horizontally; photosensors of at least 6 pieces installed at the wafer inserting section and arranged at regular intervals on positions corresponding to a peripheral portion of the wafer so as to detect an edge portion of the inserted wafer; and a rotary section arranged at the center of the wafer inserting section and rotating while being held by suction to the center of the rear surface of the wafer.

The wafer is held and conveyed on a hand plate of an exclusive carrier system or the like and then inserted horizontally at the center of the space within the wafer inserting section of the positioning apparatus.

In the state that the wafer is held on the hand plate, the six photosensors at the wafer inserting section act and the detection operation of the wafer peripheral portion is performed based on the detection signal from each sensor. The X·Y axis drive mechanism acts and the mounting stock hence the wafer inserting section is reciprocated first in the X-axis direction, and the positioning is performed so that the center positions of the wafer and the wafer inserting section are registered.

That is, first, among the six photosensors, the wafer inserting section is moved in the X-axis direction at the photosensor side to detect the edge portion of the wafer more, and the X-coordinate data is measured when each photosensor detects the edge portion of the wafer and is turned off from the ON-state or when it is turned on from the OFF-state. Next, the wafer inserting section is moved in the reverse direction to the above-mentioned case, and also the X-coordinate data is measured when each photosensor detects the edge portion of the wafer and is turned off from the ON-state or when it is turned on from the OFF-state. Then the wafer inserting section is moved in the reverse direction to the above-mentioned case to a half of the moving amount to the point that each sensor is turned off from the ON-state or turned on from the OFF-state, i.e., to the intermediate position. Thus the positioning in the X-axis direction is finished.

When the notched portion of the wafer comes to the position of the photosensor, the photosensor cannot detect the correct edge portion of the wafer. Consequently, the decision is performed regarding whether or not the edge detection point in each photosensor is on the circumference. If it is not on the circumference, the photosensor is deemed to detect the notched portion and the detection signal is ignored, and the positioning of the wafer is performed using the detection signal (the coordinate data) from residual photosensors.

Next, among the six photosensors, the wafer inserting section is moved in the Y-axis direction at the reverse side to the photosensor which cannot detect the edge portion of the wafer, and the Y-coordinate data is measured when each photosensor is turned on from the OFF state or turned off from the ON-state in similar manner to the case of the X-axis direction. Further in similar manner to the above-mentioned case, the wafer inserting section is moved to the reverse side and the Y-coordinate data is estimated when each photosensor is turned off from the ON-state or turned on from the OFF-state, and further the wafer inserting section is moved in the reverse direction to the above-mentioned case by a half between the edge portion detection coordinate points thus the positioning in the Y-axis direction is finished.

In the above-mentioned operation, only the wafer inserting section (including the rotary section and the like) is moved in the X·Y axis direction on the horizontal surface and the center position with the wafer is registered, thus the wafer is not moved and no other member is contacted with the wafer.

The hand plate of the carrier system is lowered, thereby the registered wafer is held on the rotary section by suction. Next, the rotary section is rotated, thereby rotating the wafer held by suction thereon, so that it is rotated further by a prescribed angle from the time point that one photosensor detects the notched portion of the wafer. Thereby the direction of the wafer hence the angular position is determined to the definite position.

An object of the invention is to provide a wafer positioning apparatus wherein another member such as a roller is not contacted with a peripheral portion of a wafer, and the position of the wafer can be determined with respect to the notched portion safely and accurately.

DESCRIPTION OF THE PREFERRED EMBODIMENTS

Embodiments of the invention will now be described referring to the accompanying drawings.

Figure 1:
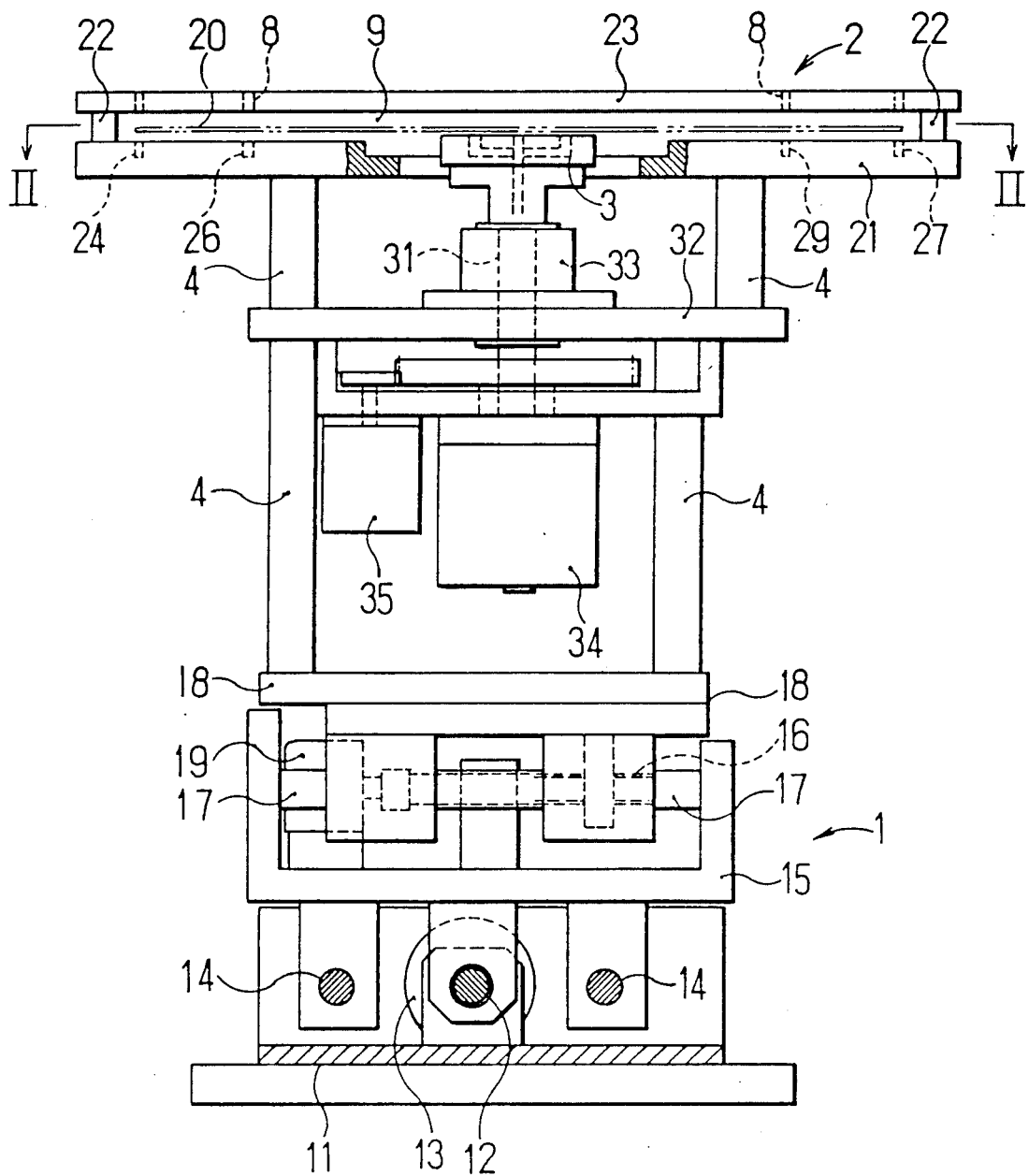
FIG. 1 is a front view partly in section of a positioning apparatus as an embodiment of the invention.

FIG. 1 is a front view partly in section of a wafer positioning apparatus. The positioning apparatus comprises X·Y axis drive mechanism 1, a wafer inserting section 2 fixed horizontally on a mounting stock 18 of the X·Y axis drive mechanism 1 through a rod frame 4, and a rotary section 3 arranged at the center of the wafer inserting section 2 and holding a wafer and rotating.

A thread shaft 12 is mounted on a base 11 of the X·Y axis drive mechanism 1 in the horizontal direction (Y-axis direction) through a bearing and can be rotationally driven by a step motor 13, and two guide shafts 14 are mounted on the base 11 in the same direction as that of the thread shaft 12 and Y-axis moving frame 15 is arranged thereon. A guide block fixed to lower side of the Y-axis moving frame 15 is slidably fitted to the outside of the guide shafts 14 at both sides, and a tapped hole of a female screw block is threadedly engaged with the thread shaft 12. Consequently, when the step motor 13 is driven, the Y-axis moving frame 15 travels in the perpendicular direction (Y-axis direction) to the paper surface of FIG. 1.

A thread shaft 16 is mounted on the Y-axis moving frame 15 in the horizontal lateral direction (X-axis direction) through a bearing and rotationally driven by a step motor 19, and guide shafts 17 are fixed to both sides of the thread shaft 16 in the same direction. A mounting stock 18 with a guide block and a female screw block installed at its lower side is arranged on the Y-axis moving frame 15, and the guide block is slidably fitted to the outside of the guide shaft 17 and the female screw block is threadedly engaged with the thread shaft 16.

Consequently, when the step motor 19 is driven, the mounting stock 18 travels in the lateral direction (X-axis direction) of FIG. 1, and when the step motor 13 on the base 11 is rotationally driven, the mounting stock 18 travels in the Y-axis direction.

The wafer inserting section 2 is fixed horizontally on the mounting stock 18 through the rod frame 4 with a plurality of rods arranged longitudinally.

Figure 2:
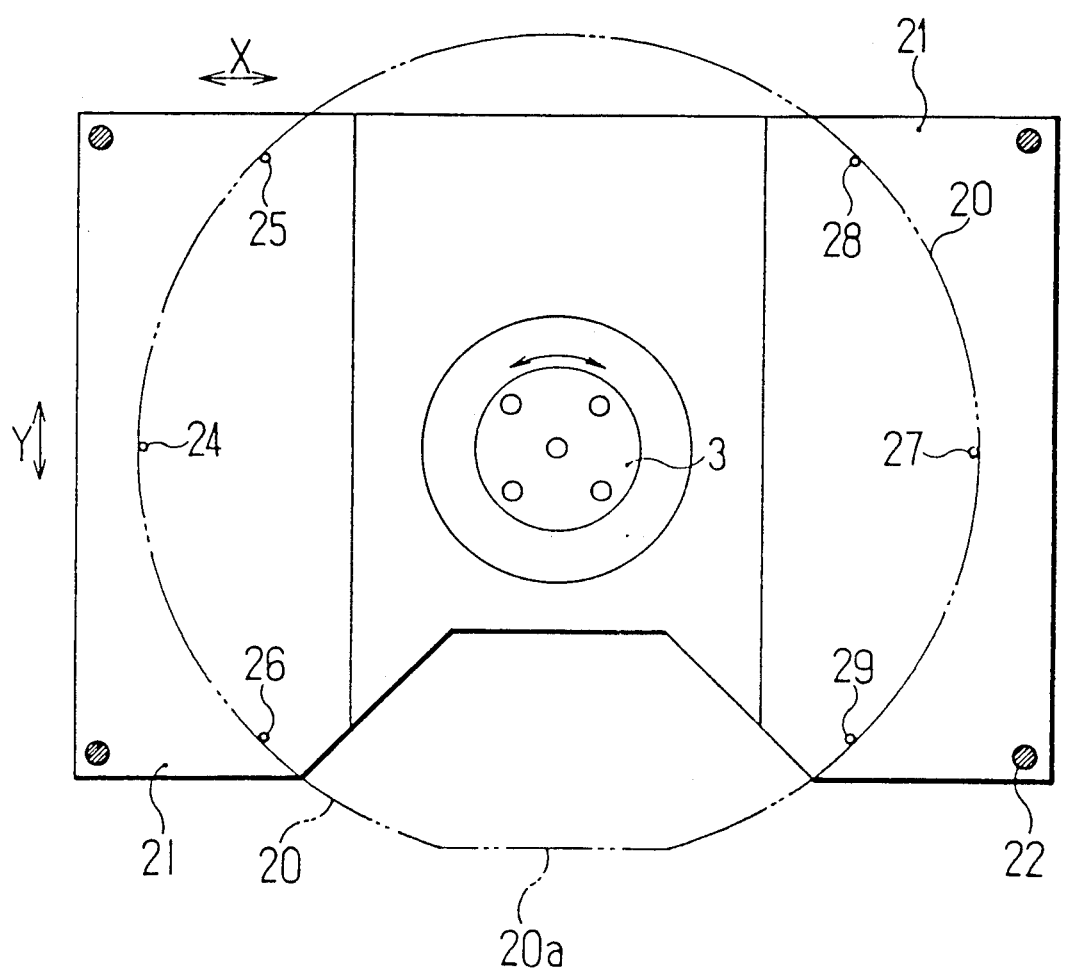
FIG. 2 is a sectional view taken on line II—II of FIG. 1.

The wafer inserting section 2 is constituted in that a cover plate 23 is fixed horizontally on a substrate 21 through four spacers 22 and a space 9 for inserting a wafer 20 is formed therebetween. As shown in FIG. 2, an opening for arranging the rotary section 3 is formed at the center of the substrate 21.

Six photosensors 24–29 for detecting a peripheral portion of the wafer 20 inserted in the space 9 are arranged on the substrate 21 of the wafer inserting section 2 at regular intervals along the circumference corresponding to the peripheral portion of the accurately inserted wafer 20 as shown in FIG. 2.

That is, in this case, the photosensors 24 and 27 are arranged at opposed positions of both ends on the center axis in the X-axis direction, and the photosensors 25 and 26 are arranged at positions corresponding to the wafer peripheral portion with spacing by 45 degrees with respect to the photosensor 24 and also the photosensors 28 and 29 are arranged at positions corresponding to the wafer peripheral portions with spacing by 45 degrees with respect to the photosensor 27. These photosensors of at least six pieces are necessary.

Since these photosensors 24–29 are sensors of transmission type, a light projection element 8 is arranged to each opposite position within the cover plate 23, however, a photosensor of reflection type may be used.

The rotary section 3 is rotatably arranged at the center position of the substrate 21 of the wafer inserting section 2. A rotary shaft 31 of the rotary section 3 is arranged vertically at lower side and supported by a bearing 33 on a mounting plate 32 fixed to the rod frame 4. The rotary shaft 31 is connected to a step motor 34 fixed to lower side of the mounting plate 32 through a bracket and the rotary section 3 is rotationally driven through the rotary shaft 31 by the step motor 34. A rotary pulse generator 35 is coupled with the rotary shaft 31 through a gear, and outputs signals corresponding to a rotational angle of the rotary section 3 to a controller (not shown).

In addition, a suction hole for adsorption is bored on the upper surface of the rotary section 3 and connected to a suction device (not shown) through a pipeline in the rotary shaft 31 or the like. The six photosensors 24–29 and the step motors 13, 19 and 34 are connected to the controller using a microcomputer and transmit detection signals, and are driven and controlled based on the control program previously stored in a memory.

Next, operation of the positioning apparatus in the above-mentioned constitution will be described.

First, the wafer 20 is taken out of an exclusive cassette or the like at holding on the hand plate 7 of the carrier system or the like, and then inserted horizontally to the center of the space 9 within the wafer inserting section 2 of the positioning apparatus.

In the state that the wafer 20 is held on the hand plate 7, the six photosensors 24–29 of the wafer inserting section 2 act, and the detection operation of the wafer peripheral portion is performed based on the detection signal from each sensor. The X·Y axis drive mechanism 1 acts, and the mounting stock 18 hence the wafer inserting section 2 is first moved in reciprocation in the X-axis direction and the positioning is performed so that the center positions of the wafer 20 and the wafer inserting section 2 are registered with respect to the x axis.

Figure 3:
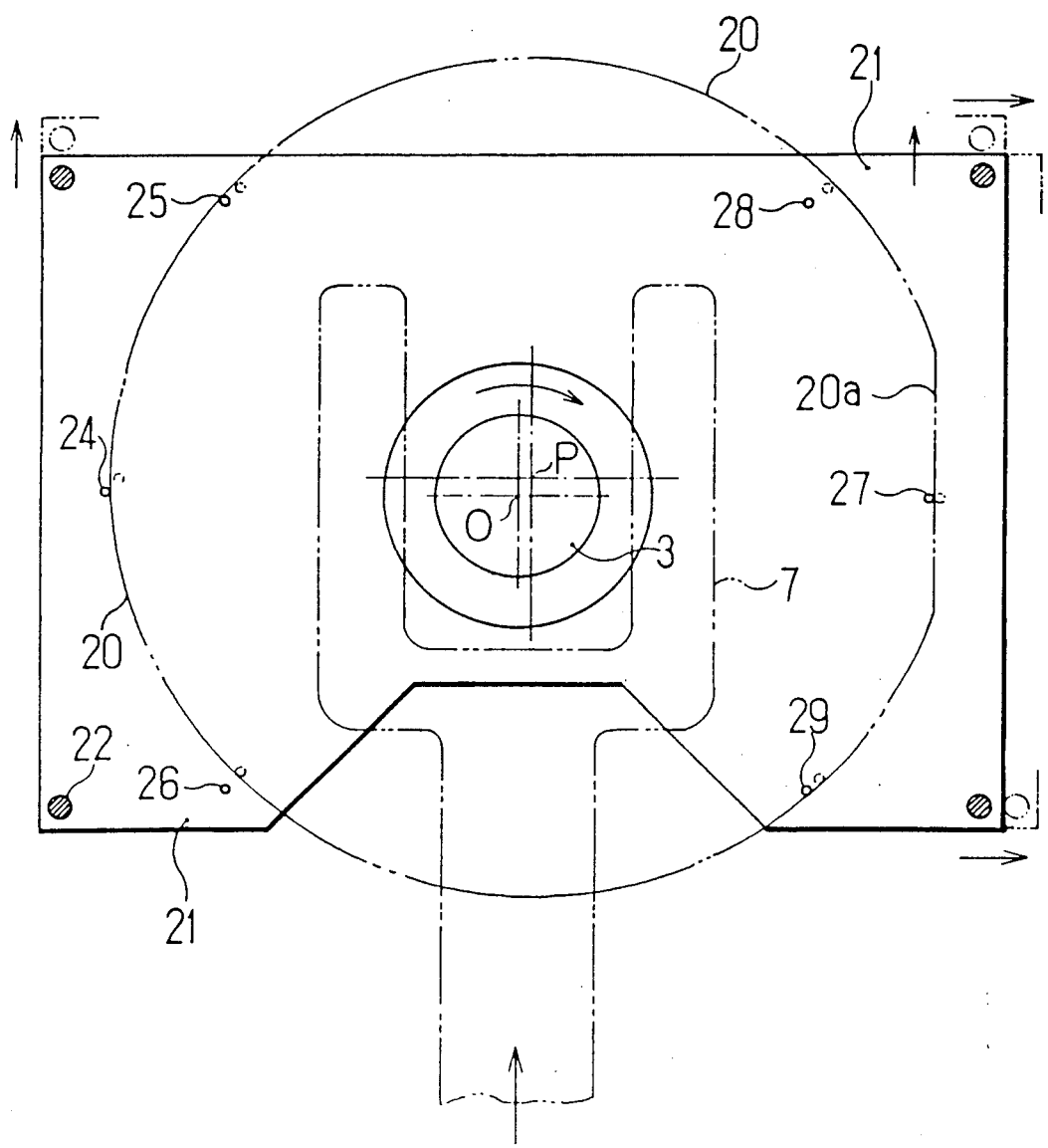
FIG. 3 is a sectional view illustrating operation at the positioning state.

For example, as shown in FIG. 3, assume that the wafer 20 is shifted from the correct center position 0 and inserted to the P position in oblique right-upward direction in the figure (center position of the inserted wafer 20).

In this case, first, the X·Y axis drive mechanism 1 acts in the X-axis direction (the right direction in the figure) at the side of the photosensors 27, 28, 29 detecting the wafer edge portion among the six photosensors and the wafer inserting section 2 is moved, and the X-coordinate data is measured at the time point that each of the photosensors 27, 28, 29 detects the edge portion of the wafer 20 and is turned off from the ON-state. Also the X-coordinate data is measured at the time point that the photosensors 24, 26 at the left side are turned on from the OFF-state.

Further, when the X-Y axis drive mechanism 1 is driven, the wafer inserting section 2 travels in the reverse direction (the left direction in the figure) to the above-mentioned direction, and in similar manner to the above-mentioned case, the X-coordinate data is measured at the time point that each of the photosensors 27, 28, 29 detects the edge portion of the wafer 20 and is turned on from the OFF-state, and also the X-coordinate data is measured at the time point that the photosensors 24, 25, 26 are turned off from the ON-state.

Next, the wafer inserting section 2 travels again to the reverse direction (right direction) thereto so that it returns to a half of the moving amount in the previous case, i.e., to the intermediate position. Thus the center position 0 of the wafer inserting section 2 (the rotary section 3) attains on the line in the Y direction passing through the center P of the wafer 20, and the positioning in the X-axis direction is finished.

Decision is performed regarding whether or not a point at an edge portion of the wafer detected by each photosensor exists on the circumference, thereby a notched portion (orientation flat) 20a of the wafer 20 coming to the position of the photosensor 27 is detected. Then the edge portion detection coordinate data from the photosensor 27 is ignored, and the positioning of the wafer 20 is performed based on the detection signal from the residual photosensors.

Next, the wafer inserting section 2 is moved in the Y-axis direction (upward direction in the figure) at the side of the photosensors 25, 28 detecting the edge portion of the wafer 20 and turned on by the action of the X-Y axis drive mechanism 1. The Y-coordinate data is measured at the time point that the photosensors 26, 29 detect the edge portion of the wafer and are turned on from the OFF-state, and also the Y-coordinate data is measured at the time point that the photosensors 25, 28 are turned off from the ON-state.

Subsequently, the wafer inserting section 20 travels in the reverse direction, i.e., in the Y-axis direction at the lower side of the figure, and in similar manner to the above description, the Y-coordinate data is measured at the time point that the photosensors 26, 29 detect the edge portion of the wafer and are turned off from the ON-state, and also the Y-coordinate data is measured at the time point that the photosensors 25, 28 are turned on from the OFF state. The wafer inserting section 2 travels again in the reverse direction (upward direction) to the abovementioned direction so that it returns to a half of the previous moving amount, i.e., to the intermediate position.

Thus the center position 0 of the wafer inserting section 2 (the rotary section 3) attains to the center position P of the wafer 20, and the positioning in the X-Y axis direction is finished.

Next, when the hand plate 7 of the carrier system is lowered, the registered wafer 20 is held by suction on the rotary section 3. The rotary section 3 is rotated by the step motor 34, and the wafer 20 held by suction thereon is rotated clockwise in FIG. 3 for example. Then the photosensor 29 is turned off from the ON-state and turned on from the OFF-state, thereby both ends of the notched portion 20a of the wafer 20 are detected.

The center position (angle) of the notched portion 20a is measured, and it is further rotated from there by a prescribed angle thereby the direction of the notched portion 20a of the wafer 20 attains to the position as shown in FIG. 2 and the positioning is performed to the definite angular position.

The wafer 20 positioned and held on the rotary section 3 reads the mark or the like displayed thereon by a camera or the like, and then is elevated again by the hand plate 7 and conveyed to a prescribed position.

According to the positioning apparatus of the present invention as above described, a wafer is held in a space within a wafer inserting section having a rotary section at the center, and the wafer inserting section is moved in the X-Y axis direction on the horizontal surface and the center position of the wafer is registered, and then the center position of the wafer is held on the rotary section and while the wafer is rotated, the notched portion of the wafer is registered to a prescribed angular position by the photosensor detecting the peripheral portion, thereby the accurate positioning can be performed in the state that no other member is contacted with the peripheral portion of the wafer, and there is no fear of breaking a weak semiconductor wafer. Also since the peripheral portion of the wafer is detected by at least six photosensors, the apparatus can be applied to the positioning of a wafer having a notched portion of not only orientation flat shape but also notch shape.

What is claimed is:

1. A wafer positioning apparatus comprising:
    a) a mounting stock;
    b) X and Y axis drive mechanisms for moving said mounting stock in the X-axis direction and the Y-axis direction in X and Y coordinates, respectively, on a horizontal plane;
    c) a wafer inserting section fixed on said mounting stock, said wafer inserting section having a space for receiving a wafer inserted horizontally;
    d) at least six photosensor means installed at said wafer inserting section and arranged at regular intervals at positions corresponding to peripheral portions of a wafer so as to detect at least two edge portions of an inserted wafer;
    e) a rotary section arranged at the center of said wafer inserting section, said rotary section rotating about a vertical axis, said rotary section comprising means for attaching by suction to the center of a rear surface of an inserted wafer; and
    f) control means for operating said X and Y drive mechanisms to center said mounting stock with respect to said inserted wafer prior to placement of the wafer on said rotary section and, after placement of the wafer, for then rotating said rotary section with said wafer held centered thereon by said suction means, and for angularly positioning said wafer in response to detection of edge portions by said photosensors means.

2. A wafer positioning apparatus comprising:
    a mounting stock
    a rod frame;
    X and Y axis drive mechanisms for moving said mounting stock in the X-axis direction and the Y-axis direction in X and Y coordinates, respectively, on a horizontal plane;
    a wafer inserting section fixed on said mounting stock, said wafer inserting section having a space for receiving a wafer inserted horizontally; said wafer inserting section further comprising a cover plate fixed horizontally on a substrate through a plurality of spacers, said substrate being fixed horizontally on said mounting stock through said rod frame;

at least six active photosensor means installed at said wafer inserting section and arranged at regular intervals at positions corresponding to peripheral portions of a wafer so as to detect edge portions of an inserted wafer; said photosensor means each comprising a light projector and a light receiver juxtaposed between said substrate and said cover plate;

a rotary section arranged at the center of said wafer inserting section, said rotary section rotating about a vertical axis, said rotary section comprising means for attaching by suction to the center of a rear surface of an inserted wafer; and control means for operating said X and Y drive mechanisms to center said mounting stock with respect to said inserted wafer prior to placement of the wafer on said rotary section and, after placement of the wafer, for then rotating said rotary section with said wafer held centered thereon by said suction means, and for angularly positioning said wafer in response to detection of said corresponding positions of said edge portions by said photosensor means.

3. A wafer positioning apparatus comprising:

a mounting stock;

a rod frame;

X and Y axis drive mechanisms for moving said mounting stock in the X-axis direction and the Y-axis direction in X and Y coordinates, respectively, on a horizontal plane;

a wafer inserting section fixed on said mounting stock, said wafer inserting section having a space for receiving a wafer inserted horizontally; said wafer inserting section further comprising a cover plate fixed horizontally on a substrate through a plurality of spacers, said substrate being fixed horizontally on said mounting stock through said rod frame;

at least six photosensors means installed at said wafer inserting section and arranged at regular intervals at positions corresponding to peripheral portions of a wafer so as to detect edge portions of an inserted wafer; two of said photosensors means being arranged at positions corresponding to first and second ends of a wafer positioned on a center axis of said X-axis; four of said other photosensors means being arranged at positions spaced, respectively, approximately 45 degrees on a horizontal plane from said first and second ends;

said photosensor means further comprising a light projector and a light receiver juxtaposed between said substrate and said cover plate;

a rotary section arranged at the center of said wafer inserting section, said rotary section rotating about a vertical axis, said rotary section comprising means for attaching by suction to the center of a rear surface of an inserted wafer; and control means for operating said X and Y drive mechanisms to center said mounting stock with respect to said inserted wafer prior to placement of the wafer on said rotary section and, after placement of the wafer, for then rotating said rotary section with said wafer held centered thereby by said suction means, and for angularly positioning said wafer in response to detection of said corresponding positions of said edge portions by said photosensor means.

* * * * *